United States Patent [19]

Kowalski et al.

[11] 4,053,065
[45] Oct. 11, 1977

[54] SEQUENCER

[75] Inventors: John Lawrence Kowalski, Phoenix; Kenneth Boyd Tippetts, Glendale, both of Ariz.

[73] Assignee: Honeywell Information Systems Inc., Phoenix, Ariz.

[21] Appl. No.: 712,563

[22] Filed: Aug. 9, 1976

[51] Int. Cl.² ............................................. B65G 57/30
[52] U.S. Cl. .................................... 214/6 M; 29/702; 29/809; 53/154
[58] Field of Search ............... 214/6 M, 8.5 F; 53/154; 29/701, 702, 703, 711, 712, 740, 809

[56] References Cited

U.S. PATENT DOCUMENTS

| | | | |
|---|---|---|---|
| 1,718,414 | 6/1929 | Gilbert et al. | 53/154 |
| 2,324,523 | 7/1943 | Lund | 214/6 M |
| 3,344,900 | 10/1967 | Drop | 29/740 |
| 3,657,790 | 4/1972 | Larrison | 29/740 |
| 3,690,471 | 9/1972 | McConnell et al. | 214/8.5 F |

*Primary Examiner*—Robert J. Spar
*Assistant Examiner*—Ross Weaver

*Attorney, Agent, or Firm*—Edward W. Hughes; William W. Holloway, Jr.

[57] ABSTRACT

A sequencer for assembling into a transferee magazine predetermined numbers of fixtures from a predetermined plurality of transferor magazines, each of which transferor magazines is adapted to hold a plurality of fixtures. Each of the fixtures stacked in a transferor magazine holds an integrated circuit (IC) chip of the same type. The transferor magazines are removably mounted on transferor bases mounted on a support member. Positoning means are also mounted on the support member and a transferee magazine is removably mounted on a transferee base secured to the positioning means. A transfer mechanism is mounted on the positioning means to transfer a fixture from a transferor magazine to the transferee magazine when the transferee magazine is in fixture transfer position with respect to a transferor magazine. Control signals cause the positioning means to position sequentially the transferee base in fixture transfer position with respect to the transferor bases on which are mounted transferor magazines and cause the transfer mechanism to load and stack in the transferee magazine a predetermined number of fixtures from predetermined transferor magazines.

18 Claims, 5 Drawing Figures

SEQUENCER

CROSS REFERENCES TO RELATED APPLICATIONS

The following applications are incorporated by reference into the subject application.

A. "Fixture for an Intergrated Circuit Chip" invented by John L. Kowalski, filed Mar. 29, 1976, Ser. No. 671,238 now U.S. Pat. No. 4,007,479 and assigned to the same assignee as the subject application.

B. "Magazine for a Plurality of Fixtures Holding Integrated Circuit Chips" invented by K. Boyd Tippetts, filed Aug. 9, 1976 Ser. No. 712,564 and assigned to the same assignee as the subject invention.

C. "Transfer Mechanism" invented by K. Boyd Tippetts, filed Aug. 9, 1976 Ser. No. 712,565 and assigned to the same assignee as the subject invention.

BACKGROUND OF THE INVENTION

1. Field of the Invention

This invention is in the field of machines for transferring objects stored in a plurality of transferor magazines, the objects in each magazine being of the same type, and collecting predetermined numbers of predetermined types of objects in a transferee magazine. Positioning means position the transferee magazine in object transfer position with selected ones of the transferor magazines and a transfer mechanism associated with the positioning means transfers predetermined number of objects from a transferor magazine into the transferee magazine. The positioning of the transferee magazine and the energization of the mechanism is preferably controlled by a microcomputer.

2. Description of the Prior Art

The development of integrated circuit (IC) chips, particularly medium and large scale IC chips, has created a need for improved manufacturing processes which lend themselves to automating the mounting of IC chips and their lead frames on substrates as part of the process of manufacturing compact electronic circuits, assemblies which are also known as micropackages. The mounting of such a chip and its lead frame in a fixture, to permit testing and to facilitate the mounting of such chips on substrates is known. Since most micropackages require a substantial number of IC chips of several different types, it is desirable to automate the step of assembling in a single holder, or magazine, the necessary numbers of fixtures holding the desired types of IC chips used to manufacture a micropackage. The sequencer of this invention has a substantial number of transferor magazines removably mounted on transferor bases with the transferor magazines each holding a plurality of fixtures and with the fixtures in each of said transferor magazines holding a given type of IC circuit. A transferee magazine and a transferee holder are mounted on positioning means that sequentially will position the transferee holder and magazine in proper fixture transfer relationship with respect to each of the transferor bases and the transferor magazines so that the transfer of a fixture from a transferor magazine into the transferee magazine can be accomplished by a transfer mechanism mounted on the positioning means. The proper positioning of the transferee magazine with respect to the transferor magazine is preferably controlled by a programmed microcomputer. When the transferee magazine is positioned in fixture transfer relation with a transferor magazine having the proper type of IC chip, the computer causes the transfer mechanism to transfer into the transferee magazine the correct number of fixtures holding the correct type of IC chip required for a given substrate, or micropackage. By varying the program of the microcomputer, one can automate the assembly of the types of IC chips needed for each type of substrate, or micropackage to be manufactured.

The closest known relevant prior art is that which was developed with respect to holders or magazines for film slides or transparencies; i.e., fixtures for holding segments of developed photographic film for use with a projector to project an enlarged image on a screen, for example. However, the prior art does not teach a sequencer which automates the collecting in one holder of a predetermined number of fixtures from predetermined ones of a plurality of different holders for each of a substantial number of different types of substrates, or micropackages.

SUMMARY OF THE INVENTION

The present invention provides a sequencer for collecting in a transferee magazine the proper number of fixtures holding the proper types of IC chips from transferor magazines. The sequencer has a support plate and a plurality of transferor bases that are mounted on the support base. The transferor magazines are removably mounted on the transferor bases. Positioning means are also mounted on the support plate, and a transferee base is mounted on the positioning means and removably holds a transferee magazine. Mounted on the positioning means and cooperating with the transferee base is a fixture transfer mechanism that is capable of removing a fixture from a transferor magazine and inserting it into the transferee magazine when the transferee magazine is in fixture transfer relationship with a transferor magazine. Control means produce the necessary control signals to cause the positioning means to bring the transferee magazine into fixture transfer relationship with predetermined ones of the transferor magazines which hold the types of chips that it is desired to load into the transferee magazine. The control means also causes the fixture transfer means to insert into the bottom of transferee magazine the desired number of chips from each transfeor magazine holding the desired types of IC chips.

It is, therefore, an object of this invention to provide a sequencer which automates the process of collecting in a single magazine or holder the right number of fixtures holding integrated circuit chips of the right type for use in subsequent manufacturing steps of electronic systems.

It is still a further object of this invention to provide a sequencer for collecting in a transferee magazine the proper number of fixtures holding the proper types of IC chips from selected ones of a group of transferor magazines. It is another object of this invention to provide a machine to automate the process of collecting in a transferee magazine the necessary numbers and types of IC chips used in manufacturing micropackages.

It is still a further object of this invention to provide a sequencer for rapidly, economically, and safely collecting the appropriate number and types of integrated circuit chips to be mounted in given micropackage.

BRIEF DESCRIPTION OF THE DRAWINGS

Other objects, features and advantages of the invention will be readily apparent from the following description of the preferred embodiment taken in conjunction with the accompanying drawings, although variations and modifications may be affected without departing from the spirit and scope of the novel concepts of the disclosure, and in which.

DESCRIPTION OF THE PREFERRED EMBODIMENT

Figure 1:
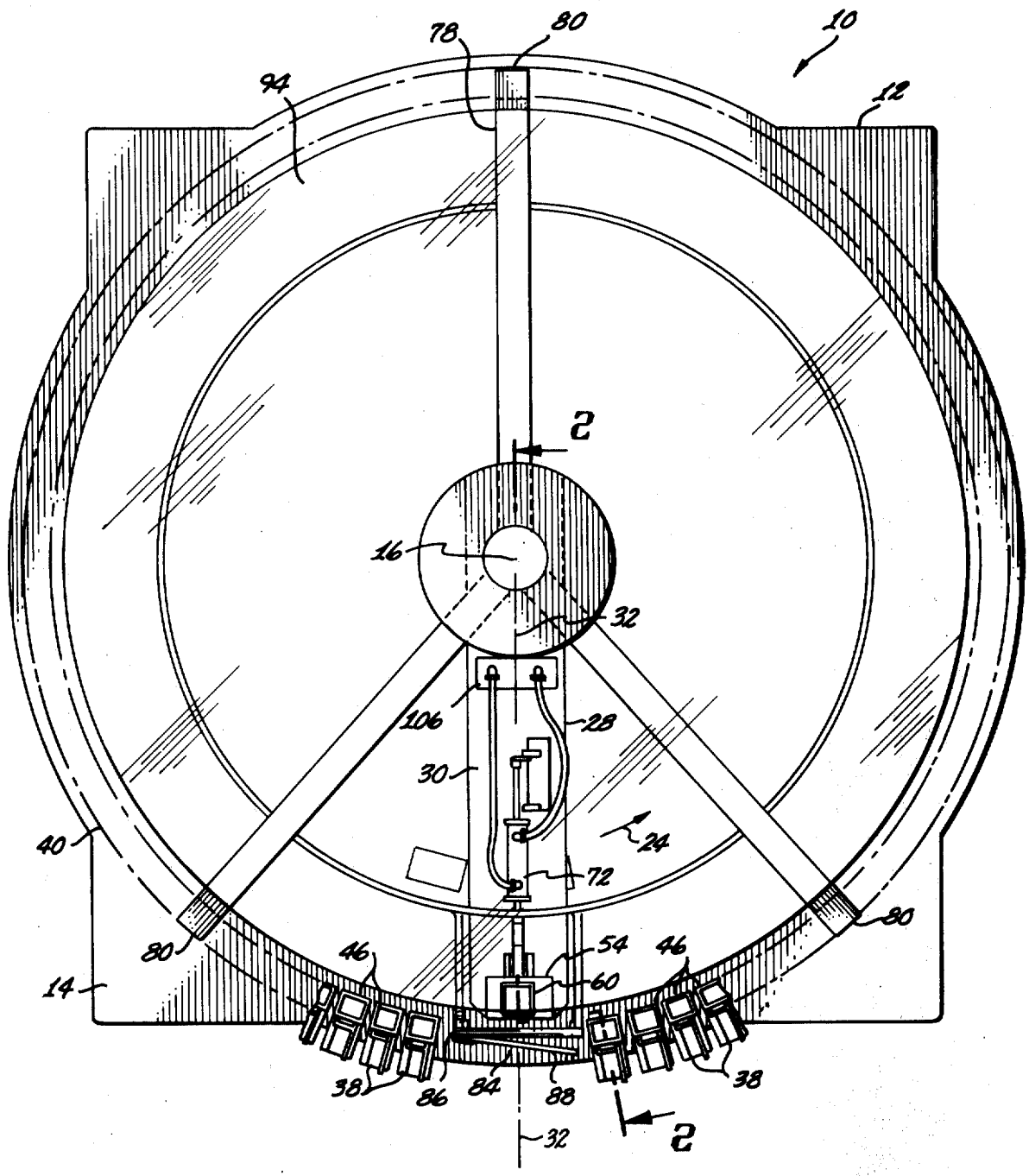
FIG. 1 is a plan view of the sequencer of the present invention illustrating various features thereof.
Figure 2:
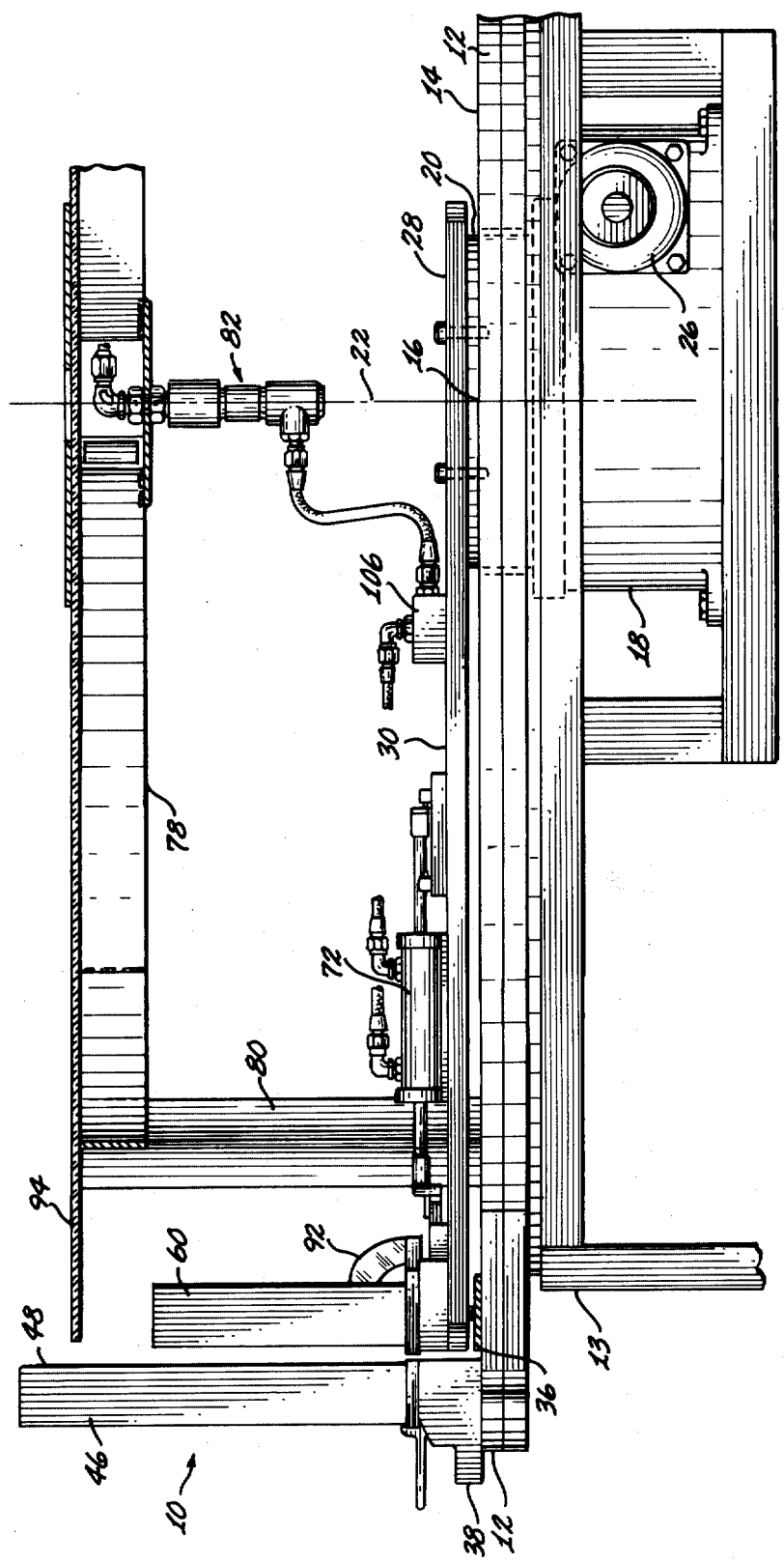
FIG. 2 is a section taken on line 2—2 of FIG. 1.

In FIGS. 1 and 2 sequencer 10 has a support member, or support plate, 12 mounted on a frame, or table 13 so that plate 12 is substantially horizontal, and at a convenient elevation above a supporting surface or floor which is not illustrated. The planar upper surface 14 of plate 12 is substantially circular with the center of the circular area designated by reference numeral 16. A conventional rotary table 18 is mounted on plate 12 with its rotatable disk 20 projecting slightly above the upper surface 14 of plate 12. The axis of rotation 22 of disk 20 is substantially perpendicular to planar surface 14, and center 16 lies on the axis of rotation 22 of disk 20. Rotary table 18 is, in a preferred embodiment, driven in a counterclockwise direction, as indicated by arrow 24, by a conventional stepping motor 26. It is, however, possible to cause disk 20 of rotary table 18 to rotate in either a clockwise or counterclockwise direction by applying appropriate pulses and control signals to stepping motor 26.

Arm 28 is rigidly attached to disk 20 or rotary table 18 and is rotated, or positioned, by disk 20. Arm 28 is preferably made of a metal such as aluminum and has a substantially rectangular planar upper surface 30. The longitudinal axis 32 of arm 28, which is also an axis of symmetry of arm 28, substantially intersects axis of rotation 22. To minimize downward deflection of the outer portion of arm 28, which in a preferred embodiment has a length of 28.75 inches, a roller 34 is mounted in the outer portion of arm 28. A segment of the periphery of rotor 34 projects below the bottom surface of arm 28 and rolls on track 36, which is mounted on the upper surface 14 of support member 12. Track 36, in a preferred embodiment, is made up of 16 segments each of which provides a portion of a circular path for roller 34.

On the outer circumferential portion of plate 12, there are located a plurality of transferor bases 38. In a preferred embodiment, 70 transferor bases, or stations, 38 are mounted on support member 12 tangent to transferor circle 40 which has its center located at 16. In a preferred embodiment circle 40 has a radius of 29 inches. The spacing between the centers of adjacent transferor bases 38 is substantially 4.7 degrees, which on a circle having a 29 inch radius, is approximately 2.38 inches. The portions of the circumference of transferor circle 40, not occupied by transferor bases 38, are used for purposes which will be pointed out below.

Figure 3:
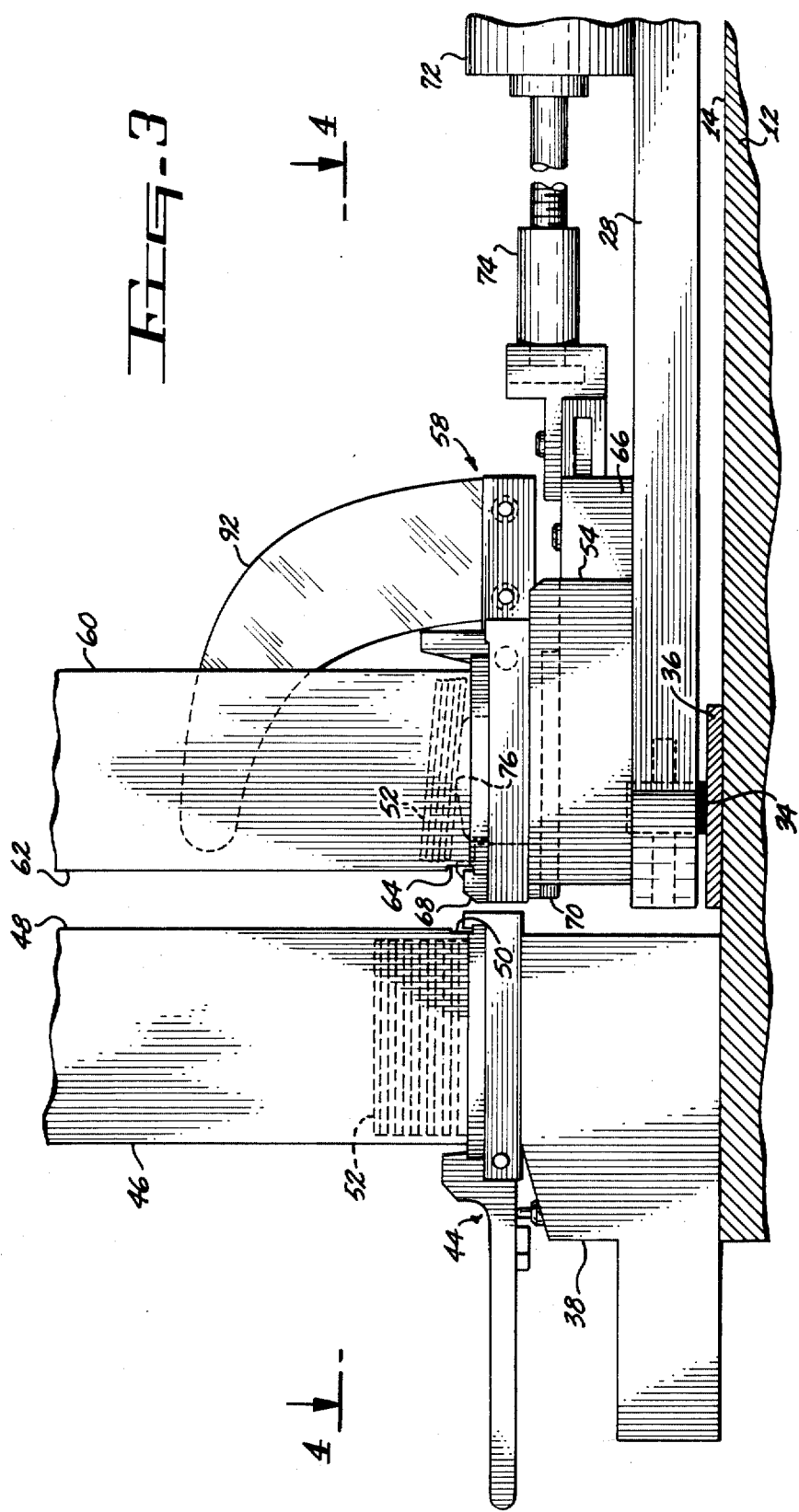
FIG. 3 is an enlarged fragmentary side elevation partly in section.

Referring to FIG. 3, each transferor base 38 has mounting means 44 for removably mounting a transferor magazine 46 thereon. Each transferor magazine 46 has a substantially planar front wall 48 and is provided with a transfer opening 50 at the bottom of wall 48. The interior of each magazine 46 is adapted to have stacked within it a plurality of objects, or fixtures, 52 of substantially the same size and shape. Transfer opening 50 is shaped so that only one fixture 52 at a time can be removed through opening 50. For a more detailed description of a fixture 52, of a transferor magazine 46, and a transferor base 38, reference is made to the applications identified in paragraphs A, B and C of the section of this application entitled Cross References to Related Applications.

Transferee base 54 is mounted on arm 28 as seen in FIG. 3, for example. Transferee base 54 has mounting means 58 for removably mounting a transferee magazine 60 or base 54. Transferee magazine 60 is substantially the equivalent of a transferor magazine 46. Magazine 60 is provided with a substantially planar front wall 62, and a transfer opening 64 is formed at the bottom of wall 62 through which a fixture 52 can be inserted or loaded into magazine 60. The dimensions of opening 64 are such that one and only one fixture 52 can be inserted through it at any time. Located within an opening through base 54 is a ball slide 66. Extractor 68 is fixedly secured to one end of the movable element 70 of ball slide 66. The other end of element 70 is connected to actuator 72 by a conventional linkage 74. Cam 76 is mounted on transferee base 54 and projects into the interior of transferee magazine 60, as is best illustrated in FIG. 3. For a more detailed description of a transferee magazine and a transferee base, reference is made to the applications identified in paragraphs B and C of the section of this application entitled Cross References to Related Applications.

Figure 4:
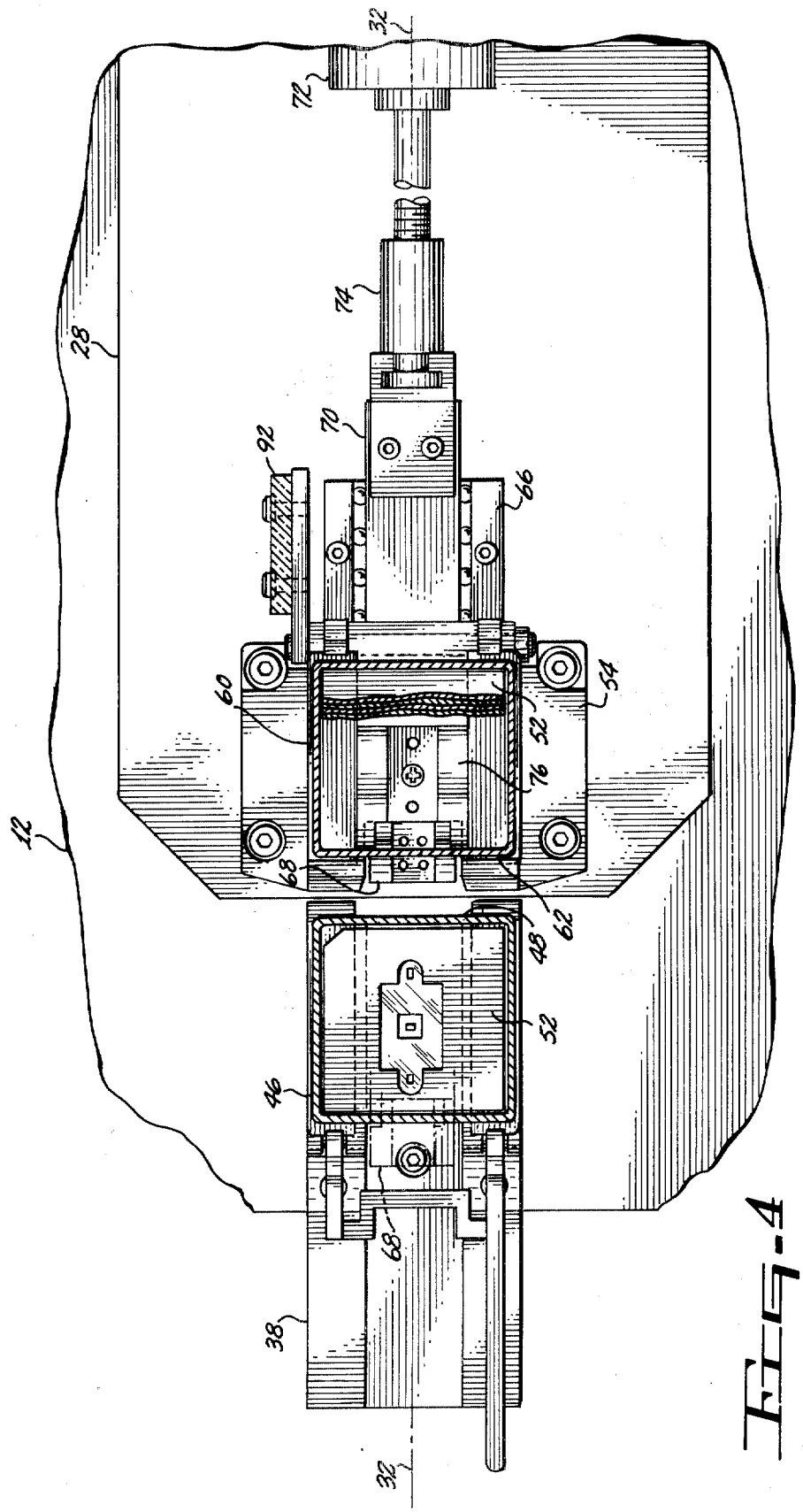
FIG. 4 is a section taken on line 4—4 of FIG. 3.

Transferee base 54 and actuator 72 are mounted on arm 28 so that the longitudinal axis 32 of arm 28 passes substantially through the center of transferee base 54. As a result, extractor 68 is substantially bisected by axis 32 and is mounted so that it can move parallel to or along axis 32 when actuator 72 is energized. Referring to FIG. 4, transferee magazine 60, which is removably mounted on transferee base 54, is in fixture transfer relationship with transferor magazine 46 when axis 32 of arm 28 substantially bisects the transferor base 38 on which the transferor magazine 46 is removably mounted. When the transferor base 38 and transferee base 54 are in fixture transfer relationship, as is illustrated in FIGS. 3 and 4, the front walls 48, 62 of magazines 46, 60 are substantially parallel to each other, are substantially perpendicular to axis 32 and are substantially bisected by a vertical plane through axis 32. The heights of transfer openings 50, 64 above surface 14 of plate 12 are also substantially equal. When a transferor magazine 46 is in fixture transfer relationship, or position, with the transferee magazine 60, actuator 72, when energized, causes extractor 68 to move through the opening in transferor base 38 to the position illustrated in dashed lines in FIG. 4 to engage the bottommost fixture 52 stacked in transferor magazine 46. The extractor 68 is then moved back to its initial position in transferee base 54 and in doing so moves the bottommost fixture 52 in the stack of such fixtures in magazine 46 through opening 50 at the base of front wall 48 of magazine 46 and inserts it through transfer opening 64 at the base of the front wall 62 of transferee magazine 60 where the interaction between extractor 68, cam 76 and the fixture 52 being transferred causes the fixture being transferred to be placed at the bottom of a stack of such fixtures in transferee magazine 60. For a more detailed description of such a transfer operation, and the relationship of these elements, reference is made to the application identified in paragraph C of the section of this application entitled Cross References to Related Applications.

To provide a mechanism to receive information from devices mounted on arm 28 and to supply control signals and energy to devices mounted on rotary arm 28, a three legged frame, or tripod 78, is secured to support plate 12. The inner surfaces of the legs 80 of tripod 78 are substantially tangent to transferor circle 40 and, thus, do not interfere with the rotation of arm 28. A rotary union and slip ring assembly 82 of conventional design is suspended substantially from the center of tripod 78 and, thus, lies on the axis of rotation 22 of disk 20 of rotary table 18. In a preferred embodiment, actuator 72 is powered by compressed air so that compressed air from a suitable source is supplied to actuator 72 through the rotary union of assembly 82 and the electrical signals needed to be supplied to or received from the components mounted on arm 28 are connected through the slip rings of assembly 82.

A loading or unloading gap or opening 84 is provided in the circumference of circle 40 where no transferor bases 38 or legs 80 are secured to plate 12. Door frame 86 is fixedly attached to tripod 78 and base 12, and door 88 is hingedly mounted on frame 86. When door 88 is open, the outer end of arm 28 is accessible to an operator for placing a transferee magazine 60 on transferee base 54 or for removing it. To facilitate this, latch arm 92 of mounting means 58 projects upwardly and toward the outer end of arm 28.

A cover 94, preferably made of a thin sheet of clear plastic material, is secured to tripod 78. The outer periphery of cover 94 is spaced fairly close to the upper front walls 48 of transferor magazines 46 as is best illustrated in FIG. 2 to prevent an operator, for example, from inadvertently inserting a finger or hand into the interior of the sequencer 10 while it is in operation. To do this the maximum width of this gap is limited to three eighths of an inch. Similarly, the magazines 46, when mounted on transferor bases 38, are sufficiently closely spaced to prevent inadvertent insertion of an operator's finger or hand into the interior of sequencer 10 between the magazines 46 or between such magazines and the legs 80 of tripod 78.

A conventional switch can be mounted on each transferor base 38 to close or complete an electrical circuit when a transferor magazine 46 is mounted on a transferor base 38. A similar switch can also be mounted on each base 38 to close, or complete, an electrical circuit if a fixture 52 is stacked in a transferor magazine 46 mounted on a transferor base 38. Similarly a switch can be mounted on frame 86 to close or complete an electrical circuit when door 88 is closed to block off the interior of the sequencer 10. Since the use of switches for similar functions is well known in the art, the switches and the manner of mounting them has been omitted from the drawings.

Figure 5:
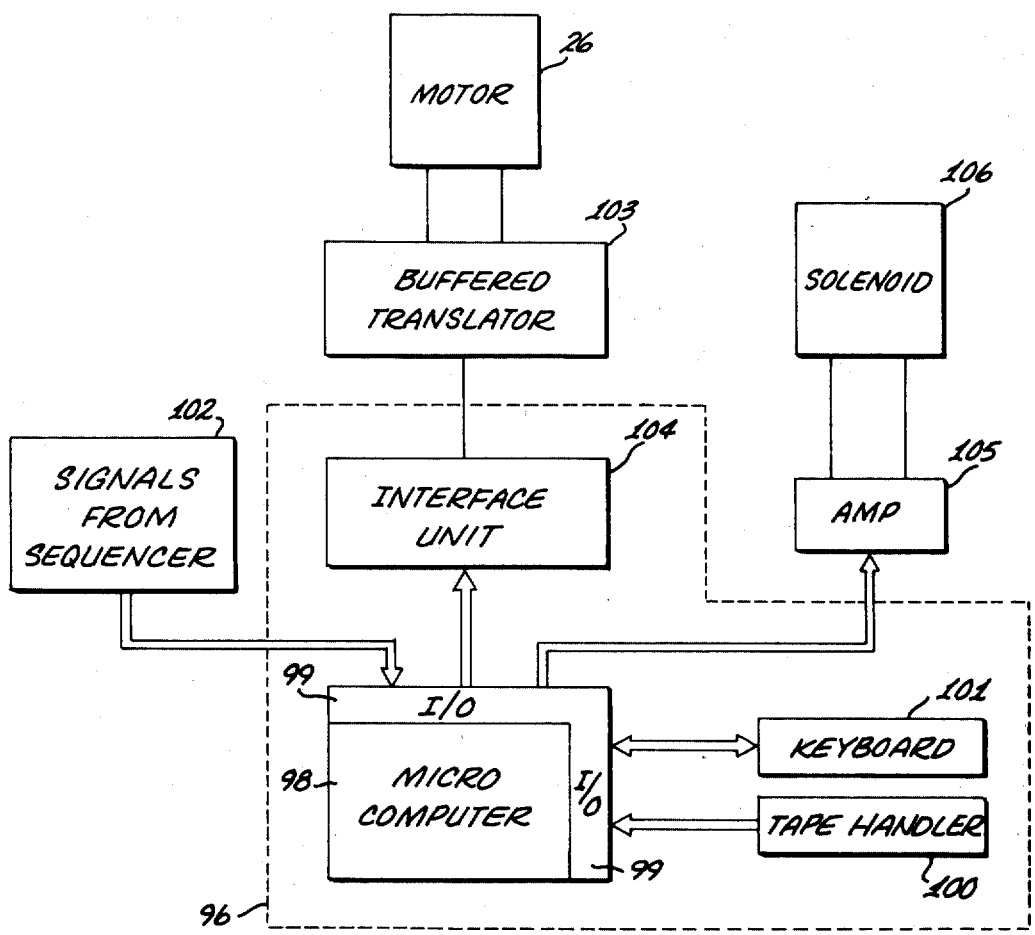
FIG. 5 is a block diagram of the controls of the sequencer.

Referring to FIG. 5 control means 96 provides control signals that control the positioning of arm 28 and the energization of actuator 72 to transfer a fixture from a transferor magazine to a transferee magazine. In a preferred embodiment control means 96 comprises a microcomputer 98 which is provided with an input/output (I/O) subsystem 99 through which digital information is supplied to microcomputer 98 and through which digital information is transmitted from computer 98. Certain information required by computer 98 is supplied by a tape handler 100 and the information received is stored in the random access memory subsystem of computer 98. Keyboard terminal and display unit 101 also can be used to supply control information and data to the computer 98 and to display for the benefit of the operator information produced by computer 98 in response to a program, or programs, stored in the memory subsystem of the microcomputer 98. In addition, various signals can be supplied to microcomputer 98 from conventional switches and other types of sensors which may be useful in properly controlling sequencer 10. Such sources are generally designated by block 102.

Stepping motor 26 is driven by a conventional buffered translator 103. Computer 98 will, in one mode of operation, produce signals representing the number of pulses that are required to be applied to the motor 26 to drive arm 28 from a first position, or station, to a second position or station. The signals representing the number of pulses needed to do this is applied to interface unit 104 which produces the desired number of pulses and applies them serially to buffered translator 103. Buffered translator 103 produces the same number of pulses which are applied to motor 26 at rates that are consistent with the physical characteristics of the positioning means which include rotary table 18 and arm 28 so that motor 26 will precisely, and in a minimum period of time, position arm 28 in response to the number of pulses supplied to it from buffer translator 103.

When arm 28 is positioned so that a transfer of a fixture from a transferor magazine to a transferee magazine can occur, i.e., transferee magazine 60 is in fixture transfer relationship with a designated transferor magazine 46, computer 98 will transmit a signal to the solenoid amplifier 105 causing amplifier 105 to produce a power signal of sufficient, voltage, amperage and for a sufficient period of time to cause solenoid 106 to which it is applied to properly energize actuator 72. Such energization causes extractor 68 to transfer a fixture 52 from a transferor magazine 46 into the transferee magazine 60. Obviously, such a fixture transfer operation can be repeated until the desired number of fixtures 52 from a given transferor magazine 46 have been loaded into transferee magazine 60.

In a preferred embodiment, stepping motor 26 makes one revolution for each 200 pulses applied to it by the buffer translator 103, and a total of 36,000 pulses must be applied to stepping motor 26, to rotate disk 20 through 360 degrees. As a result, one pulse supplied to motor 26 from buffered translator 103 substantially produces a rotation of disk 20 equal to 0.01° degrees. In a preferred embodiment the circumference of circle 40 is divided into 70 transfer stations at each of which a transferor base 38 is located. In Table A, the angular displacement of each station from the initial point, or zero position, is given.

PULSE COUNT & ANGLE FROM HOME (0-0)

Table A

| Sta | Deg Angle | Sta | Angle | Sta | Angle |
| --- | --- | --- | --- | --- | --- |
| 1 | 10.8 | 25 | 128.3 | 49 | 245.8 |
| 2 | 15.5 | 26 | 133.0 | 50 | 250.5 |
| 3 | 20.2 | 27 | 137.7 | 51 | 255.2 |
| 4 | 24.9 | 28 | 142.4 | 52 | 259.9 |
| 5 | 29.6 | 29 | 147.1 | 53 | 264.6 |
| 6 | 34.3 | 30 | 151.8 | 54 | 269.3 |
| 7 | 39.0 | 31 | 156.5 | 55 | 274.0 |
| 8 | 43.7 | 32 | 161.2 | 56 | 278.7 |
|   | 48.4 | 33 | 165.9 | 57 | 283.4 |
| 9 | 53.1 | 34 | 170.6 | 58 | 288.1 |
| 10 | 57.8 | 35 | 175.3 | 59 | 292.8 |
| 11 | 62.5 |   | 180.0 | 60 | 297.5 |

Table A-continued

| Sta | Deg Angle | Sta | Angle | Sta | Angle |
|---|---|---|---|---|---|
| 12 | 67.2 | 36 | 184.7 | 61 | 302.2 |
| 13 | 71.9 | 37 | 189.4 | 62 | 306.9 |
| 14 | 76.6 | 38 | 194.1 | | 311.6 |
| 15 | 81.3 | 39 | 198.8 | 63 | 316.3 |
| 16 | 86.0 | 40 | 203.5 | 64 | 321.0 |
| 17 | 90.7 | 41 | 208.2 | 65 | 325.7 |
| 18 | 95.4 | 42 | 212.9 | 66 | 330.4 |
| 19 | 100.1 | 43 | 217.6 | 67 | 335.1 |
| 20 | 104.8 | 44 | 222.3 | 68 | 339.8 |
| 21 | 109.5 | 45 | 227.0 | 69 | 344.5 |
| 22 | 114.2 | 46 | 231.7 | 70 | 349.2 |
| 23 | 118.9 | 47 | 236.4 | | |
| 24 | 123.6 | 48 | 241.4 | | |

Legs 80 of tripod 78 are located between stations 8 and 9, 35 and 36, and 62 and 63. Loading gap or opening 84 is between station 70 and 1. The zero degree, or initial position, is in the center of gap 84. The angles listed in Table A are to the center of the stations, thus when arm 28 is at station 5, for example, axis 32 of arm 28 will form an angle of 29.6° with a radius through the initial position and will bisect the transferor base 38 at station 5.

In operation a transferor magazine 46 is mounted on each of the transferor bases 38 and each of the transferor magazines 46 will have stacked in it a plurality of up to 200 fixtures 52 with the fixtures in each magazine holding the same type of IC chip. Arm 28 will then be driven to its initial position where door 88, which normally closes opening 84, can be opened by the operator and an empty transferee magazine 60 can be mounted on transferee base 54. The operator then transmits to computer 98 by means of the keyboard 101 indicia, numbers or letters or both, which uniquely identify one list of IC chips by type and quantity needed to manufacture a micropackage and which chips are to be loaded into the transferee magazine 60 mounted on arm 28. In response to the receipt of the signals representing such a list, computer 98 causes tape handler 100 to find the corresponding list and load that list of IC part types and the number of each such part type into the memory subsystem of computer 98. Previously, the computer memory was provided with the type of IC chip stacked in each magazine 46 of each transferor station 38. If all predetermined conditions are satisfied, some of which are, for example, that door 88 is closed, that a transferor magazine 46 is mounted on each of the transferee bases 38 and that an empty transferee magazine 60 has been mounted on the transferee base 54, then computer 98 will determine the angle through which arm 28 must be driven to reach the first station at which a transferor magazine is located which has stacked in it IC chips of the type appearing on the list.

If it is assumed that this is station 5, for example, then by reference to table 1 it is seen that arm 28 must be rotated through 24.9°. In the embodiment illustrated, stepping motor 26 will require 2,490 pulses to be applied to it to rotate arm 28 through 24.9°. Computer 98 will provide signals representing 2,490 to the interface unit 104 which will then apply 2,490 pulses serially to the buffer translator 103. Buffer translator 103 applies 2,490 pulses in a preordained manner to motor 26 which pulses cause motor 26 to rotate until arm 28 is in fixture transfer relationship with respect to the transferor magazine 46 mounted on the transferor base 38 at station 5. Before arm 28 reaches station 5, computer 98 will check to see if there are fixtures 52 stacked in the transferor magazine at station 5. If there are, then computer 98 will apply a signal to solenoid amplifier 105 which will energize solenoid 106 to cause the actuator 72 to complete a transfer cycle, i.e., will cause the extractor to move underneath the transferor magazine, wait a few thousandths of a second to permit a fixture 52 to drop into position and then will load the bottommost fixture into the transferee magazine 60 on arm 28. The transfer cycle will be repeated until that number of fixtures holding IC chips of the type stored in the transferee magazine 46 at location 5 which is specified in the list has been loaded into transferee magazine 60. In the event that the computer program calls for a fixture to be transferred from a magazine at a given location and there is no fixture in the magazine prior to a transfer cycle, then the sequencer will either stop and notify the operator of the reason for stopping, or in the event that the same type or part is available in a second transferor magazine at another station, the computer will calculate the number of pulses required to cause arm 28 to rotate to that station, will apply that number to the interface unit 104 which applies the called for number of pulses to buffered translator 103 which provide the pulses to rotate motor 26 to properly position arm 28.

At the completion of the transfer of a predetermined number of fixtures holding IC chips of the type specified by the list from a transferor magazine or magazines to the transferee magazine 60, computer 98 will then calculate the angle through which arm 28 must be rotated to reach the next transfer station where the next type of IC chip specified is stacked. The process as described above will be repeated until the proper number of each of the various types of IC circuit chips needed for a given micropackage have been loaded into transferee magazine 60. Computer 98 will then produce signals which will cause arm 28 to rotate until it returns to its zero position where it stops. Obviously such a cycle can be repeated so that the number and types of IC chips needed for various different types of substrates can be accumulated with the chips for each such substrate or micropackage preferably being accumulated in one transferee magazine.

Sequencer 10 has the capability of stacking fixtures 52 in transferee magazine 60 in the order that the integrated circuit chip types will be used in the next step of the manufacturing process. If the arrangement, or order, of the IC chips in the transferee magazine is not important, and the only criteria imposed on sequencer 10 is to have the right number of the right types of IC chips loaded into transferee magazine 60, then it is possible by arranging transferor magazines 46 in ascending order by IC chip part type number from station 1 to station 70, for example, for arm 28 to start from its initial, or zero, position and rotate in a counterclockwise direction only. In the course of making a complete circle, arm 28 will stop at each of the stations mounting tranferor magazines holding the types of integrated circuit chips that are to be collected in the transferee magazine 60 needed to manufacture a given micropackage.

It is also possible by varying the radius of transferor circle 40 to increase or decrease the number of transferor stations. It is obviously desirable that the number of stations equal, or exceed, the number of IC types that would be used in manufacturing a micropackage, for example. Obviously, the number of transferor stations is also a function of the width of the transferor magazines 46. Thus, a tradeoff must be made between the number of stations, the size of the fixture 52, the radius of circle 40, and the benefit of using only one transferee magazine to hold the chips for each micropackage versus the cost of a sequencer, to determine the optimum number of transfer stations and thus the size of sequencer 10.

In the preferred embodiment the rotary table 18 is a model 12TC3B manufactured by the Superior Electric Company of Bristol, Connecticut, stepping motor 26 is a M112 supplied by Superior Electric, the microprocessor is an Intel Model 8080A, the tape handler is a Cipher Model C-200, the keyboard is a Micro Switch Model 53SW1-2, and the buffered translator is a BTR 103RT which is also manufactured by the Superior Electric Company.

While the preferred embodiment uses a microcomputer to produce the control signals because of the flexibility and speed and reliability that is associated with digital computer control, obviously other sources of control signals can be used. For instance, the signals could be supplied by a tape reader with the positions or stations of the transferor magazine and the number of fixtures to be transferred at each station being specified on a paper tape, a magnetic tape, or a disk for each of the different types of micropackages to be built. Similarly control signals could be applied directly from a conventional keyboard to motor 26 and the actuator 72 by an operator.

It should be evident from the foregoing that various modifications can be made to the described embodiments without departing from the scope of the present invention.

We claim as our invention:

1. A sequencer for assembling in a transferee magazine a plurality of objects of substantially the same size and shape from a plurality of transferor magazines; said sequencer comprising:
   a support member,
   a plurality of transferor bases mounted on said support member, each of said transferor bases adapted to removably hold a transferor magazine;
   a plurality of transferor magazines adapted to hold a plurality of said objects, one transferor magazine being mounted on each transferor base;
   positioning means mounted on said support member;
   a transferee base mounted on said positioning means, said transferee base adapted to removably hold a transferee magazine;
   a transferee magazine mounted on said transferee base;
   means mounted on said positioning means for transferring an object from a transferor magazine mounted on a transferor base to the transferee magazine mounted on the transferee base when the transferee magazine is positioned by the positioning means in object transfer relationship with a transferor magazine; and
   control means for causing said positioning means to sequentially place the transferee magazine in object transfer relationship with predetermined ones of said transferor magazines and to cause the means for transferring an object, to transfer into the transferee magazine a predetermined number of objects from said predetermined transferor magazines.

2. The sequencer of claim 1 in which the control means includes a digital computer.

3. The sequencer of claim 1 in which the positioning means is an arm mounted for rotation about an axis of rotation by being fixedly secured to the rotatable disk of a rotary table mounted on the support member.

4. The sequencer of claim 1 in which the means for transferring an object from a transferor magazine to the transferee magazine includes an actuator operatively connected to an extractor.

5. A sequencer for transferring from a plurality of transferor magazines and assembling in a transferee magazine an assemblage of fixtures, each of the fixtures being of substantially the same size and shape, and each adapted to hold one integrated circuit chip, each of said transferor magazines adapted to hold a plurality of said fixtures, the assemblage of fixtures in the transferee magazine holding IC chips of the types and in the numbers specified; comprising:
   a support plate,
   a plurality of transferor bases mounted on said support plate, each of said transferor bases adapted to hold a transferor magazine,
   a plurality of transferor magazines, each transferor magazine adapted to hold a plurality of fixtures, each fixture held by a transferor magazine adapted to hold an integrated circuit chip of a given type, and one transferor magazine being mounted on each transferor base,
   positioning means mounted on said support member;
   a transferee base mounted on said positioning means, said transferee base adapted to removably hold a transferee magazine;
   a transferee magazine, said transferee magazine being mounted on said transferee base;
   means for transferring a fixture from a transferor magazine mounted on a transferor base to the transferee magazine mounted on the transferee base when the transferee magazine is positioned in fixture transfer relation with said transferor magazine; and
   control means for causing the positioning means to sequentially place the transferee magazine in fixture transfer relation with predetermined ones of said transferor magazines and to cause the means for transferring a fixture, to transfer a predetermined number of fixtures from each of said predetermined transferor magazines into the transferee magazine.

6. The sequencer of claim 5 in which the control means includes a programmed digital computer.

7. The sequencer of claim 5 in which the positioning means includes an arm mounted on the rotatable disk of a rotary table, said rotary table being mounted on the support plate.

8. The sequencer of claim 5 in which the means for transferring a fixture is a pneumatically powered actuator linked to an extractor.

9. In combination:
   a support member having a top planar surface, said surface having a center,
   a rotary table, said table having a disk rotating about an axis of rotation, said rotary table mounted on the support member so that the axis of rotation of the disk is substantially perpendicular to the top surface of the support member and so that the center of the support member lies on the axis of rotation of the disk;
   a stepping motor operatively connected to the rotary table for rotatively positioning the disk of the rotary table,
   an arm fixedly attached to the disk of the rotary table for rotation by the disk about the center of the support member, said arm having an outer end portion;

a plurality of transferor magazines having a front wall and means forming a transfer opening at the bottom of the front wall, said transferor magazines adapted to hold a plurality of substantially identically shaped objects, said transfer opening permitting such objects to be removed through said transfer opening;

a plurality of transferor bases, each of said bases having mounting means adapted to removably mount a transferor magazine on each of the transferor bases, a transferor magazine mounted on each of the transferor bases said transferor bases being mounted on said support member so that when a transferor magazine is mounted on said transferor base, the front walls of the transferor magazine are substantially equidistant from the center of the support member, are tangent to a transferor circle having a radius equal to said distance, the center of said circle being at the center of the support member, and the heights of the transfer openings of said magazines above the support member are substantially equal;

a transferee magazine having a front wall and means forming a transfer opening at the bottom of said front wall, said transferee magazine adapted to hold a plurality of objects transferred into the transferee magazine from transferor magazines;

a transferee base having mounting means adapted to removably mount a transferee magazine on the transferee base, a transferee magazine mounted on the transferee base, said transferee base being mounted on the outer end portion of the arm so that the front wall of the transferee magazine is substantially perpendicular to a radius through the center of the support member and the transfer opening of the transferee base substantially lies in the plane of the transferor openings;

an actuator mounted on the arm;

an extractor;

means connecting the extractor to the actuator; and control means for energizing the actuator and for positioning the arm so that the extractor when actuated by the actuator transfers an object from a transferor magazine to the transferee magazine.

10. The combination of claim 9 in which the control means includes a digital microcomputer.

11. The combination of claim 9 in which the actuator is pneumatically powered.

12. The combination of claim 9 in which the disk of the rotary table is above the top planar surface of the support member.

13. The combination of claim 12 in which the outer portion of the arm is provided with means to minimize deflection of the arm.

14. A sequencer comprising:

a support member having a top planar surface, said surface having a center, a rotary table, said table having an axis of rotation, and being mounted on the support member so that the axis of rotation of the rotary table is substantially perpendicular to the top surface of the support member and so that the center of the support member lies on the axis of rotation of the rotary table;

a stepping motor operatively connected to the rotary table responsive to congtrol signals for rotatively positioning the rotary table, an arm having a longitudinal axis, said arm being fixedly attached to the rotary table for rotation by the rotary table and so that the longitudinal axis of the arm substantially intersects the axis of rotation of the rotary table, said arm having an outer end portion;

a plurality of transferor magazines having a planar front wall and means forming a transfer opening at the bottom of the front wall, said transferor magazines adapted to hold a plurality of substantially identically shaped fixtures, each of said transfer openings permitting such objects to be removed therethrough;

a plurality of transferor bases, each of said bases having means for removably mounting a transferor magazine on a transferor base, a transferor magazine mounted on each transferor base, said transferor bases being mounted on said support member so that the front walls of the transferor magazine are substantially equidistant from the center of the support member and are substantially tangent to a transferor circle having a radius substantially equal to said distance, the center of the circle being at the center of the support member, and the height of the transfer opening of said magazines above the support member being substantially equal;

a transferee magazine having a planar front wall and means forming a transfer opening at the bottom of said front wall, said transferee magazine adapted to have a plurality of fixtures transferred into it, a transferee base having mounting means for removable mounting a transferee magazine on the transferee base, a transferee magazine mounted on said transferee base, said transferee base being mounted on the outer end portion of the arm so that the front wall of the transferee magazine mounted on it is substantially perpendicular to the longitudinal axis of the arm, so that the height of transfer opening above the support member substantially equals the height of the transfer openings of the transferor magazine, and so that the distance between the transfer opening of the transferee magazine and the transfer opening of a given transferor magazine with respect to which the transferee magazine is in fixture transfer position, is substantially one half the dimension of the fixture to be transferred in the direction parallel to the longitudinal axis of the arm;

an actuator mounted on the arm, an extractor mounted on the arm;

means connecting the actuator to the extractor;

said actuator when energized in response to control signals causing the extractor to transfer to the transferee magazine a fixture from a transferor magazine in fixture transfer relationship to the transferee magazine;

means for producing control signals for the stepping motor and the actuator; and circuit means for applying control signals to the stepping motor and the actuator to position the arm so that the transferee magazine mounted on the transferee base is in fixture transfer relationship with transferor magazines on predetermined transferor bases and to cause the extractor to transfer to the transferee magazine predetermined numbers of fixtures from predetermined transferor magazines.

15. The sequencer of claim 14 in which the means for producing control signals includes a programmed digital microcomputer.

16. The sequencer of claim 14 in which the actuator is pneumatically powered.

17. The sequencer of claim 14 in which the outer end portion of the arm is provided with means to minimize downward deflection of the arm.

18. The sequencer of claim 17 in which the means to minimize downward deflection of the arm include a roller in the outer end portion of the arm and a substantially circular track on the top planar surface of the support member; the center of the circular track substantially coinciding with the center of the support member, and the roller engaging the track.

* * * * *